(12) United States Patent
Lim et al.

(10) Patent No.: US 8,901,608 B2
(45) Date of Patent: Dec. 2, 2014

(54) TRANSISTOR AND METHOD OF FABRICATING THE SAME

(71) Applicant: Electronics and Telecommunications Research Institute, Daejeon (KR)

(72) Inventors: Jong-Won Lim, Daejeon (KR); Hokyun Ahn, Daejeon (KR); Woojin Chang, Daejeon (KR); Dong Min Kang, Daejeon (KR); Seong-Il Kim, Daejeon (KR); Sang-Heung Lee, Daejeon (KR); Hyung Sup Yoon, Daejeon (KR); Chull Won Ju, Daejeon (KR); Hae Cheon Kim, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/908,076

(22) Filed: Jun. 3, 2013

(65) Prior Publication Data

US 2014/0159115 A1    Jun. 12, 2014

(30) Foreign Application Priority Data

Dec. 11, 2012  (KR) .......................... 10-2012-0143702

(51) Int. Cl.
*H01L 33/00* (2010.01)
*H01L 29/66* (2006.01)
*H01L 29/778* (2006.01)

(52) U.S. Cl.
CPC ........ *H01L 29/778* (2013.01); *H01L 29/66431* (2013.01)
USPC ......................................... 257/194

(58) Field of Classification Search
USPC ........... 257/E21.205, E21.624, E21.638, 324, 257/410, 411, E29.132–E29.138, 257/E29.162–E29.165, E21.625, E21.639, 257/151–153, 249, 314–320, 331, 366, 367, 257/412, E29.125–E29.131, 257/E29.134–E29.138, E29.14–E29.161, 257/E29.275, E29.319, E21.176–E21.186, 257/E21.374, E21.458, E21.634, E27.015, 257/E27.017, E27.03–E27.032; 438/157–158, 179, 182, 257, 266, 286, 438/299, 303, 305, 574, 652, 176, 195, 267, 438/283, 585–596, 202–208, 234–239, 167, 438/172
See application file for complete search history.

(56) References Cited

U.S. PATENT DOCUMENTS

6,284,613 B1 * 9/2001 Subrahmanyam et al. ... 438/307
(Continued)

*Primary Examiner* — Dao H Nguyen
*Assistant Examiner* — Tram H Nguyen
(74) *Attorney, Agent, or Firm* — Rabin & Berdo, P.C.

(57) ABSTRACT

A high electron mobility transistor includes a T-type gate electrode disposed on a substrate between source and drain electrodes and insulating layers disposed between the substrate and the T-type gate electrode. The insulating layers include first, second, and third insulating layers. The third insulating layer is disposed between the substrate and a head portion of the T-type gate electrode such that a portion of the third insulating layer is in contact with a foot portion of the T-type gate electrode. The second insulating layer is disposed between the substrate and the head portion of the T-type gate electrode to be in contact with the third insulating layer. The first insulating layer and another portion of the third insulating layer are sequentially stacked between the substrate and the head portion of the T-type gate electrode to be in contact with the second insulating layer.

20 Claims, 9 Drawing Sheets

(56) References Cited

U.S. PATENT DOCUMENTS

| | | |
|---|---|---|
| 6,387,783 B1 | 5/2002 | Furukawa et al. |
| 6,891,235 B1 * | 5/2005 | Furukawa et al. ............ 257/408 |
| 7,456,058 B1 * | 11/2008 | Peidous et al. ................ 438/182 |
| 7,573,078 B2 | 8/2009 | Wu et al. |
| 7,662,698 B2 | 2/2010 | Tabatabaie |
| 2004/0029330 A1 * | 2/2004 | Hussain et al. ............... 438/172 |
| 2006/0170062 A1 * | 8/2006 | Kim et al. ...................... 257/382 |
| 2007/0057288 A1 * | 3/2007 | Kim et al. ...................... 257/192 |
| 2008/0142884 A1 * | 6/2008 | Cho ............................... 257/344 |
| 2013/0187197 A1 * | 7/2013 | Lim et al. ...................... 257/194 |
| 2013/0320349 A1 * | 12/2013 | Saunier et al. ................. 257/76 |

* cited by examiner

TRANSISTOR AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0143702, filed on Dec. 11, 2012, the entirety of which is incorporated by reference herein.

BACKGROUND

The inventive concept relates to transistors and methods of fabricating the same and, more particularly, to high electron mobility transistors and methods of fabricating the same.

A high electron mobility transistor (HEMT) is a kind of compound semiconductor device. Generally, one or more layers included in the HEMT have lattice constants very different from those of other layers, such that a structure of a material used as a channel layer may be modified. A mobility of electrons in the channel layer of the HEMT may be improved by the stress modification according the lattice mismatch, such that an operating speed of the HEMT may be improved.

It is difficult to grow a substrate for the HEMT. However, the HEMT has higher power and improved noise characteristics by an increase of the density of charges transmitted to the channel layer and by the high electron mobility. Thus, the HEMT may be operated at a high frequency. The HEMTs have excellent electron speed characteristics as compared with an electronic device using silicon, so that they are widely used in device applications of microwave and millimetric wave bands.

Gallium nitride (GaN) corresponding to a nitride semiconductor is a direct transition type semiconductor. The gallium nitride is attractive as a new material of high frequency electronic devices because of its a high electric field electron mobility (e.g., $2 \times 10^{-7}$ cm/s) and a high breakdown electric field (e.g., $3 \times 10^6$ V/cm). The nitride semiconductor may be realized as a heterojunction structure such as aluminum-gallium nitride/gallium nitride (AlGaN/GaN). Additionally, the nitride semiconductor may be selective doped. Thus, the nitride semiconductor maybe designed to have an optimized structure for a high speed. Due to the above physical properties of the nitride semiconductor, an electronic device including the nitride semiconductor may improve trade off relationship between a cutoff frequency (ft) and a breakdown voltage ($V_{BV}$) which is a problem in in a conventional field effect transistor (FET). Thus, the electronic device including the nitride semiconductor may have high voltage and high frequency characteristics.

If a FET includes the nitride semiconductor which has a great power density as well as the high voltage operation characteristic and is used in an amplifier module, a peripheral circuit such as a power distribution synthesis circuit and a direct current (DC) voltage converting circuit may be omitted or simplified in the amplifier module. Thus, it is possible to realize a high power amplifier module having high power usage efficiency.

Additionally, a high speed semiconductor device may use a T-shape, Y-type or mushroom-type gate having a wide cross-sectional area in order that a resistance of the gate is reduced to improve its noise characteristic. The T-type, Y-type, or mushroom-type gate is generally formed by an electron beam (E-beam) lithography method or a photolithography method.

However, a resolution of the photolithography method may be insufficient for forming a gate electrode having a fine width. Thus, the E-beam lithography method may be mainly used to form the gate electrode. Generally, a double-layered or triple-layered photoresist layer in the E-beam lithography method.

SUMMARY

Embodiments of the inventive concept may provide high electron mobility transistors capable of improving stability, of reducing a parasitic capacitance and resistance, of maintaining a fine width, of increasing a breakdown voltage, and of improving a cutoff frequency.

Embodiments of the inventive concept may also provide methods of fabricating a high electron mobility transistor capable of improving stability, of reducing a parasitic capacitance and resistance, of maintaining a fine width, of increasing a breakdown voltage, and of improving a cutoff frequency.

In one aspect, a high electron mobility transistor may include: a source electrode and a drain electrode spaced apart from each other on a substrate; a T-type gate electrode disposed on the substrate between the source electrode and the drain electrode; and a plurality of insulating layers disposed between the substrate and the T-type gate electrode. The plurality of insulating layers may include a first insulating layer, a second insulating layer, and a third insulating layer. The third insulating layer may be disposed between the substrate and a head portion of the T-type gate electrode such that a first portion of the third insulating layer may be in contact with a foot portion of the T-type gate electrode. The second insulating layer may be disposed between the substrate and the head portion of the T-type gate electrode such that the second insulating layer may be in contact with the third insulating layer. The first insulating layer and a second portion of the third insulating layer may be sequentially stacked between the substrate and the head portion of the T-type gate electrode so as to be in contact with the second insulating layer.

In an embodiment, the substrate may be an insulating substrate. The insulating substrate may include silicon, silicon carbide, or sapphire.

In an embodiment, the foot portion of the T-type gate electrode may have a width within a range of about 0.1 μm to about 0.3 μm.

In an embodiment, the plurality of insulating layers may include silicon nitride or silicon oxide.

In an embodiment, the high electron mobility transistor may further include: a field plate electrode disposed between the T-type gate electrode and the source electrode or between the T-type gate electrode and the drain electrode. The field plate electrode may be in contact with a sidewall portion or a bottom portion of the head portion of the T-type gate electrode. The first insulating layer may also be disposed between the substrate and an entire bottom surface of the field plate electrode. A top surface of the field plate electrode may be disposed at a lower level than a top surface of the head portion of the T-type gate electrode.

In another aspect, a method of fabricating a high electron mobility transistor may include: forming a source electrode and a drain electrode spaced apart from each other on a substrate; forming a first insulating layer on an entire surface of the substrate; forming a photoresist layer having a first opening exposing a portion of the first insulating layer between the source electrode and the drain electrode; removing the portion of the first insulating layer under the first opening to expose the substrate under the first opening; forming a second insulating layer on the entire surface of the substrate, wherein a portion of the second insulating layer in the first opening defines a second opening having a narrower width than the first opening; removing the second insulating layer under the second opening to expose the substrate under the second opening; removing the photoresist layer and the rest portion of the second insulating layer except the portion of the second insulating layer defining the second opening; forming a third insulating layer on the entire surface of the surface to define a third opening in the second opening, the third opening having a narrower width than the second opening; removing the third insulating layer under the third opening to expose the substrate under the third opening; removing portions of the first, second, and third insulating layers to expose the source electrode and the drain electrode; and forming a T-type gate electrode contacting the substrate through the third opening. A head portion of the T-type gate electrode may have a width greater than the width of the first opening.

In an embodiment, the substrate may be an insulating substrate. The insulating substrate may include silicon, silicon carbide, or sapphire.

In an embodiment, the third opening may have a width within a range of about 0.1 μm to about 0.3 μm.

In an embodiment, the first, second, and third insulating layers may include silicon nitride or silicon oxide.

In an embodiment, the method may further include: forming a field plate electrode between the T-type gate electrode and the source electrode or between the T-type gate electrode and the drain electrode.

In an embodiment, forming the field plate electrode may include: forming a first image reversal photoresist pattern on the first insulating layer, the first image reversal photoresist pattern having a forth opening exposing a portion of the first insulating layer; forming a conductive layer on the exposed portion of first insulating layer and on the first image reversal photoresist pattern; and removing the first image reversal photoresist pattern and the conductive layer disposed on the first image reversal photoresist pattern to leave the conductive layer disposed on the exposed portion of the first insulating layer. The forth opening may be formed to be adjacent to the field plate electrode.

In an embodiment, the field plate electrode may be in contact with a sidewall portion or a bottom portion of the head portion of the T-type gate electrode.

In an embodiment, each of the first, second, and third insulating layers under the first, second, and third openings may be removed using a reactive ion etching method.

In an embodiment, forming the T-type gate electrode may include: forming a second image reversal photoresist pattern having a fifth opening on the substrate having the exposed source and drain electrodes, the fifth opening having a width greater than the width of the first opening; forming a conductive layer in the third and fifth openings and on the second image reversal photoresist pattern; and removing the second image reversal photoresist pattern and the conductive layer on the second image reversal photoresist pattern to leave the conductive layer disposed in the third and fifth openings.

In an embodiment, the method may further include: removing the first and third insulating layers around the T-type gate electrode.

BRIEF DESCRIPTION OF THE DRAWINGS

The inventive concept will become more apparent in view of the attached drawings and accompanying detailed description.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
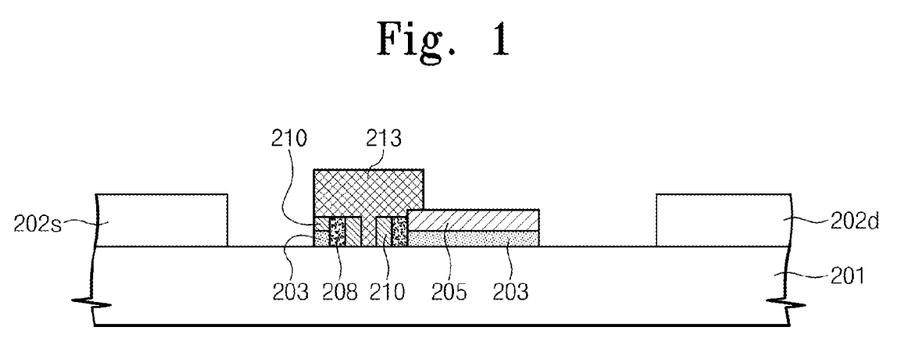
FIG. 1 is a cross-sectional view illustrating a high electron mobility transistor according to exemplary embodiments of the inventive concept.

FIG. 1 is a cross-sectional view illustrating a high electron mobility transistor according to exemplary embodiments of the inventive concept.

Referring to FIG. 1, a high electron mobility transistor includes a substrate 201, a source electrode 202s, a drain electrode 202d, a T-type gate electrode 213, and a plurality of insulating layers 203, 208, and 210. The high electron mobility transistor may further include a field plate electrode 205.

The substrate 201 may be an insulating substrate on which an epitaxial layer (not shown) is grown. The insulating substrate may include silicon, silicon carbide (SiC), or a sapphire. The insulating substrate may be doped with dopant ions.

The source electrode 202s and the drain electrode 202d may be disposed on the epitaxial layer. The source and drain electrodes 202s and 202d may be spaced apart from each other. The source and drain electrodes 202s and 202d may include a conductive material. For example, the source and drain electrodes 202s and 202d may include a titanium-aluminum-nickel-gold (Ti—Al—Ni—Au) alloy. For example, titanium, aluminum, nickel, and gold may be stacked and then a rapid thermal treatment may be performed on the stacked titanium, aluminum, nickel, and gold to form the titanium-aluminum-nickel-gold (Ti—Al—Ni—Au) alloy.

The T-type gate electrode 213 may be disposed on the substrate 201 between the source electrode 202s and the drain electrode 202d. The T-type gate electrode 213 may consist of a foot portion having a narrow width and a head portion having a wide width. The head portion is disposed on the foot portion. The foot portion of the T-type gate electrode 213 may have a width within a range of about 0.1 µm to about 0.3 µm.

The plurality of insulating layers 203, 208, and 210 may be disposed between the substrate 201 and the T-type gate electrode 213. The plurality of insulating layers 203, 208, and 210 may include a first insulating layer 203, a second insulating layer 208, and a third insulating layer 210. The third insulating layer 210 may be disposed between the substrate 201 and the head portion of the T-type gate electrode 213. A portion of the third insulating layer 210 may be in contact with the foot portion of the T-type gate electrode 213. The second insulating layer 208 may be disposed between the substrate 201 and the head portion of the T-type gate electrode 213, so as to be in contact with the third insulating layer 210. The first insulating layer 203 and another portion of the third insulating layer 210 may be sequentially stacked between the substrate 201 and the head portion of the T-type gate electrode 213, so as to be in contact with the second insulating layer 208. The plurality of the insulating layers 203, 208, and 210 may include silicon nitride (SiN) or silicon oxide ($SiO_2$).

The field plate electrode 205 may be disposed on the substrate 201 between the T-type gate electrode 213 and the source electrode 202s or between the T-type gate electrode 213 and the drain electrode 202d. The first insulating layer 203 may also be disposed between the substrate 201 and the field plate electrode 205. The field plate electrode 205 may be disposed at a region where an electric field is greatly generated in operation of the high electron mobility transistor. In particular, the field plate electrode 205 may be disposed on the substrate 201 between the T-type gate electrode 213 and the drain electrode 202d. The field plate electrode 205 may be in contact with a sidewall portion or a bottom portion of the head portion of the T-type gate electrode 213. A top surface of the field plate electrode 205 may be disposed at a lower level than a top surface of the head portion of the T-type gate electrode 213.

Since the high electron mobility transistor according to the inventive concept includes the plurality of the insulating layers 203, 208, and 210 supporting the T-type gate electrode 213, stability of the T-type gate electrode 213 may be improved and a fine width of the foot portion of the T-type gate electrode 213 may be maintained. Additionally, the high electron mobility transistor has the insulating layers 203, 208, and 210 confined between the head portion of the T-type gate electrode 213 and the substrate 201. Thus, a drain output characteristic may be improved and it is possible to reduce parasitic capacitances between the T-type gate electrode 213 and the source electrode 202s and between the T-type gate electrode 213 and the drain electrode 202d. Moreover, since the high electron mobility transistor has the T-type gate electrode 213 of which a length is reduced, a cutoff frequency and a high frequency characteristic of the high electron mobility transistor may be improved. Furthermore, since a double-layered or triple-layered electron beam photoresist layer is not used for fabrication of the high electron mobility transistor, a fabricating time and fabricating costs of the high electron mobility transistor may be reduced. As a result, it is possible to realize the high electron mobility transistor of the low fabrication costs, the improved stability, the reduced parasitic capacitance, and the improved high frequency characteristic.

Additionally, the high electron mobility transistor according to embodiments further includes the field plate electrode 205 contacting the sidewall portion or the bottom portion of the head portion of the T-type gate electrode 213. Thus, an electric field concentrated at a lower corner of the head portion of the T-type gate electrode 213 may be effectively relieved. As a result, a breakdown voltage of the high electron mobility transistor may increase, so that a high voltage characteristic of the high electron mobility transistor may also be improved.

Figure 2A:
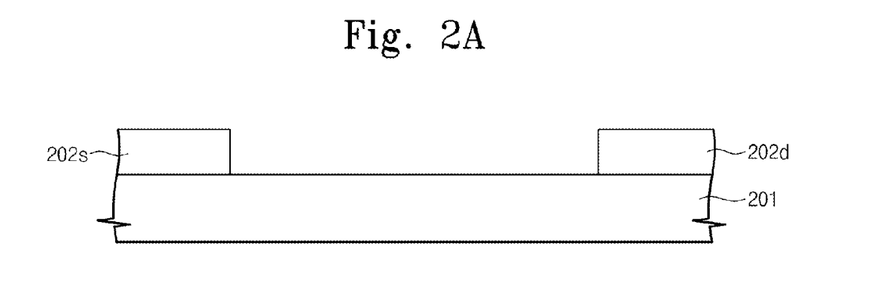
FIGS. 2A to 2R are cross-sectional views illustrating a method of fabricating a high electron mobility transistor according to exemplary embodiments of the inventive concept.
Figure 2B:
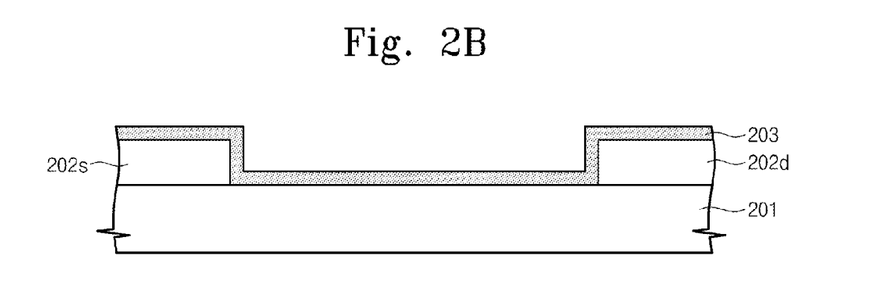
Figure 2C:
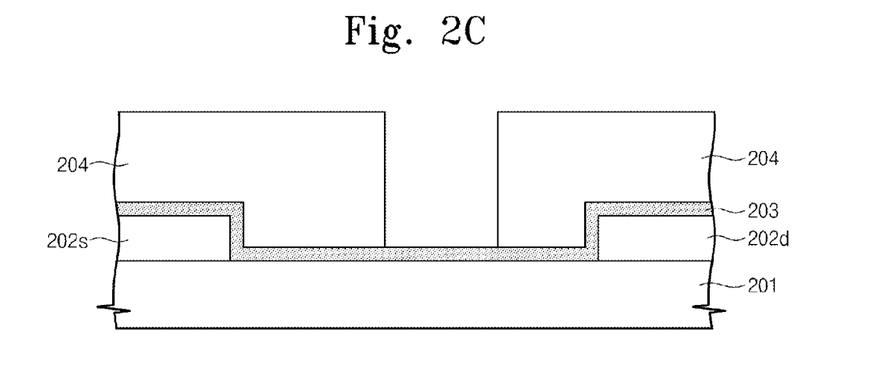
Figure 2D:
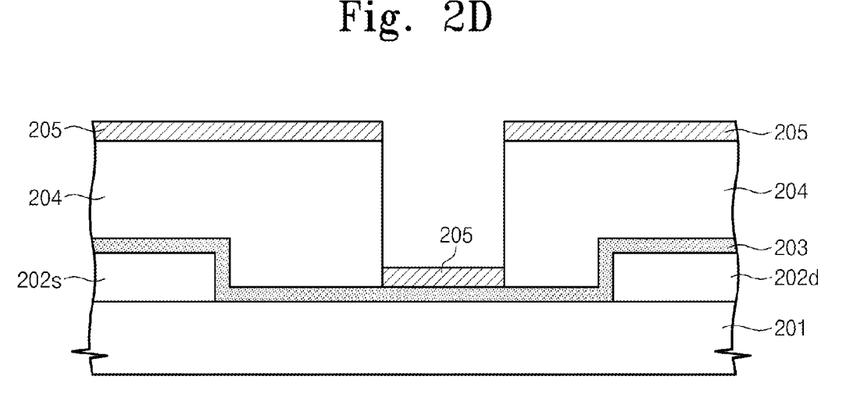
Figure 2E:
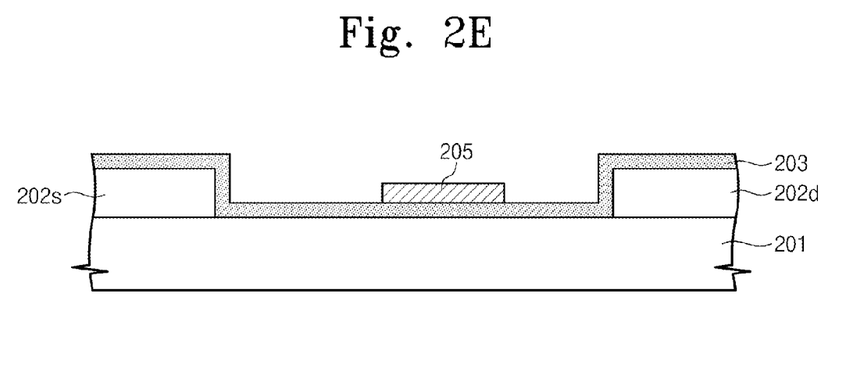
Figure 2F:
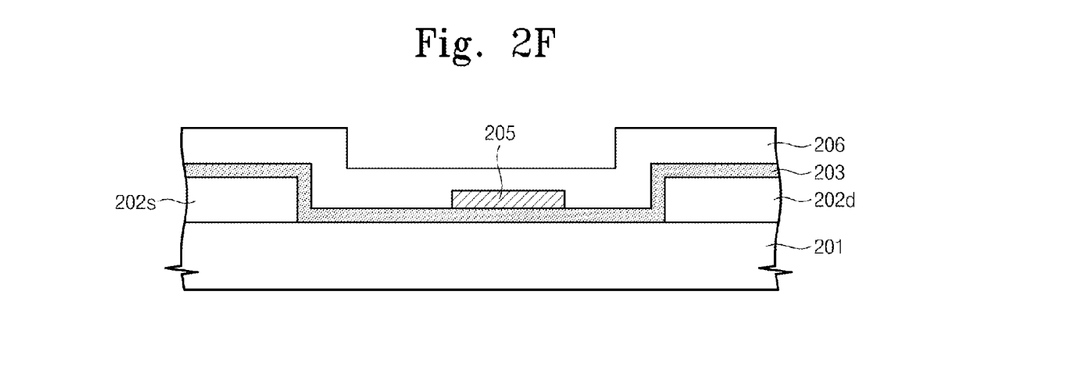
Figure 2G:
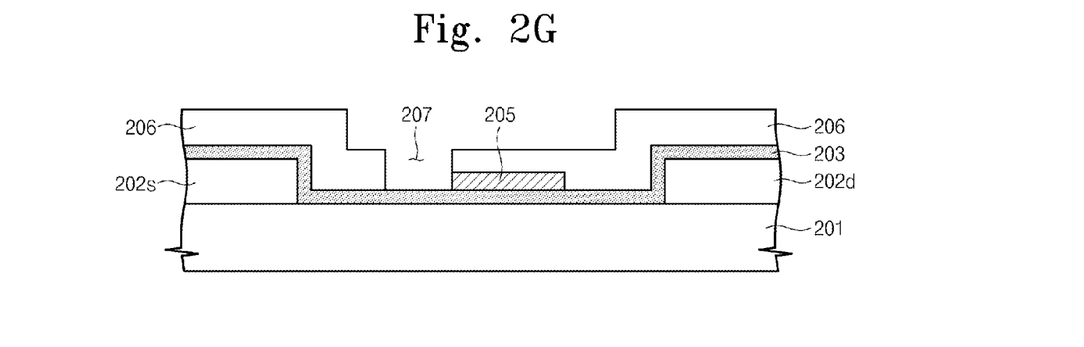
Figure 2H:
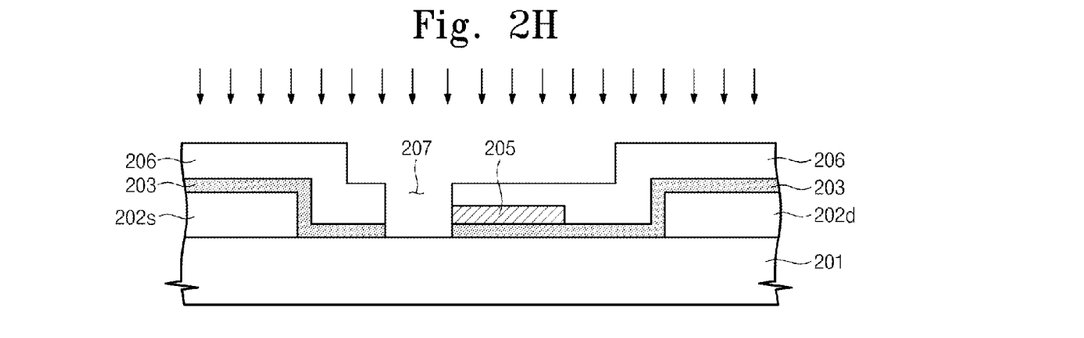
Figure 2I:
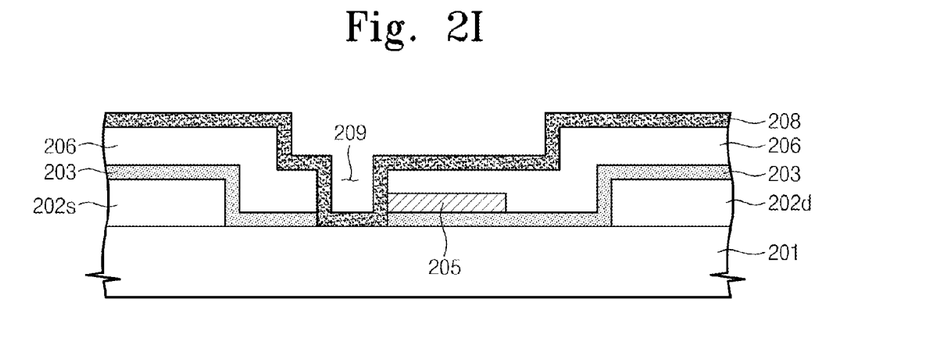
Figure 2J:
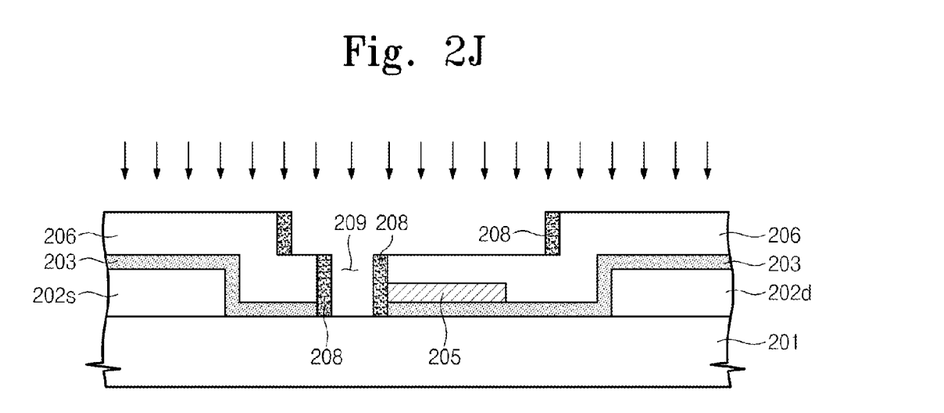
Figure 2K:
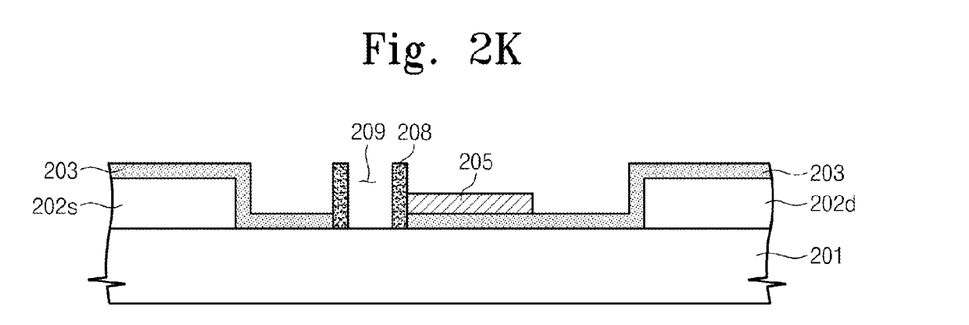
Figure 2L:
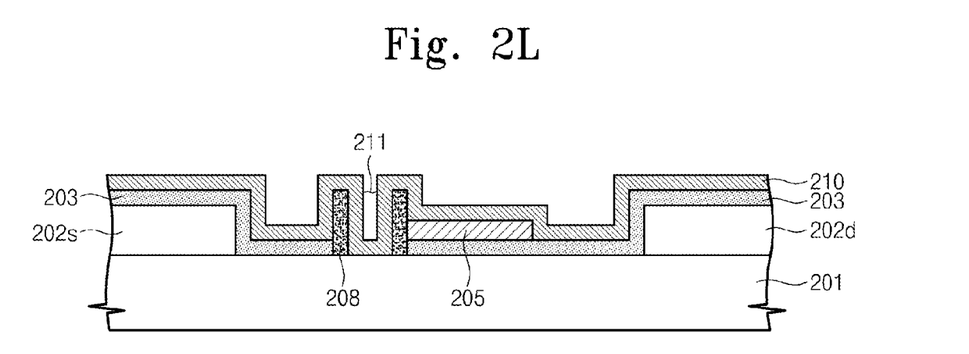
Figure 2M:
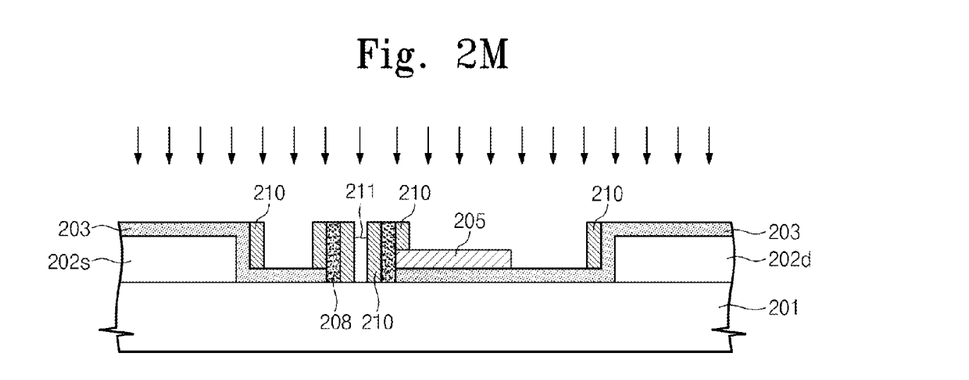
Figure 2N:
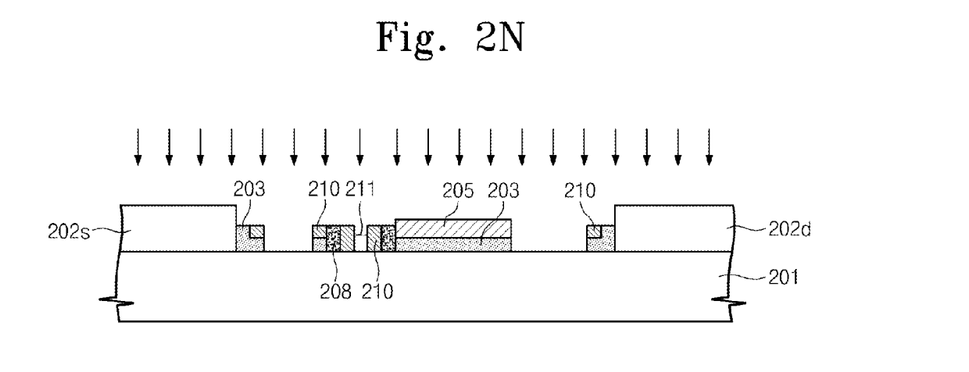
Figure 2O:
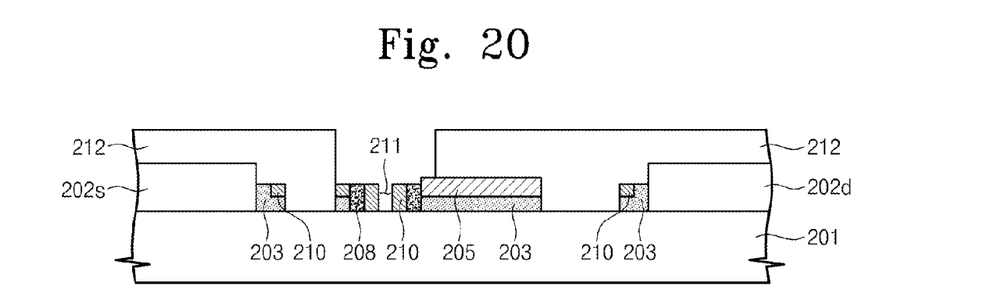
Figure 2P:
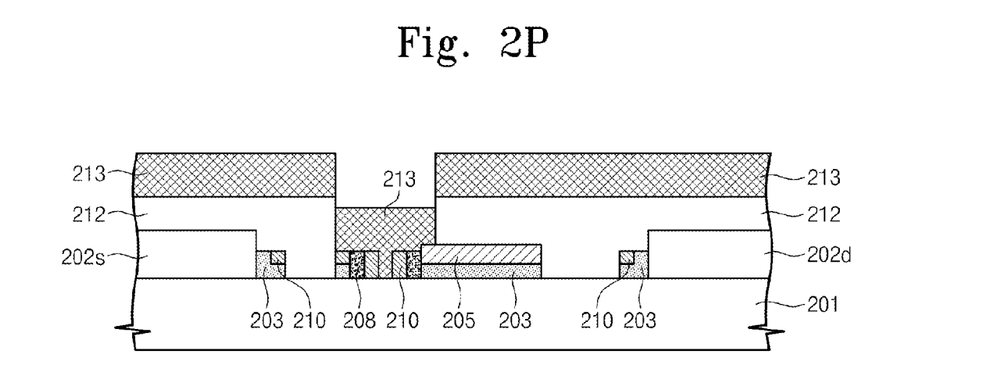
Figure 2Q:
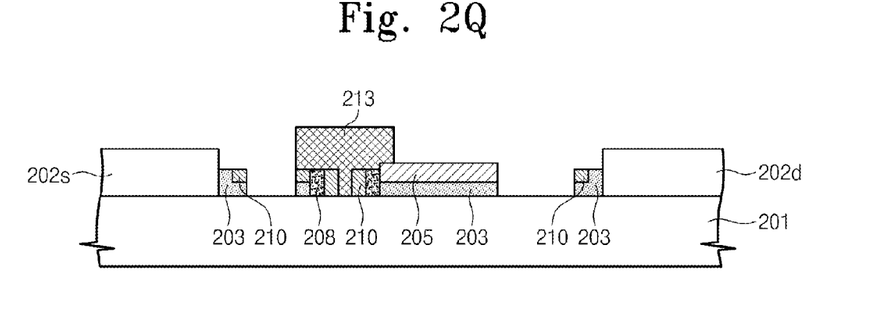
Figure 2R:
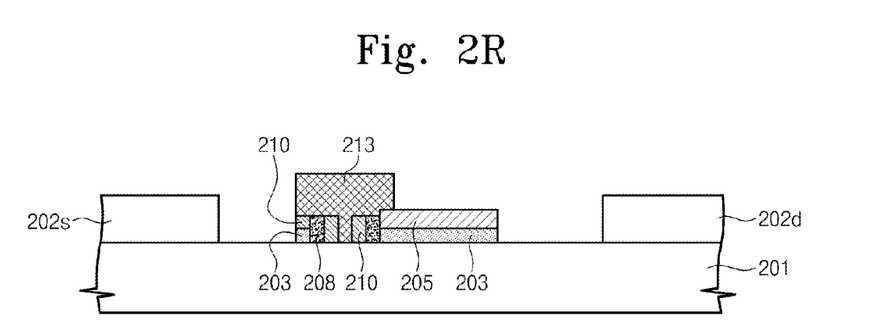

FIGS. 2A to 2R are cross-sectional views illustrating a method of fabricating a high electron mobility transistor according to exemplary embodiments of the inventive concept.

Referring to FIG. 2A, a source electrode 202s and a drain electrode 202d which are spaced apart from each other may be formed on a substrate 201.

The substrate 201 may be an insulating substrate on which an epitaxial layer (not shown) is grown. The insulating substrate may include silicon, silicon carbide, or a sapphire. The insulating substrate may be doped with dopant ions.

The source electrode 202s and the drain electrode 202d may be spaced apart from each other on the epitaxial layer.

The source and drain electrodes 202s and 202d may include a conductive material. For example, the source and drain electrodes 202s and 202d may include a titanium-aluminum-nickel-gold (Ti—Al—Ni—Au) alloy formed by performing a rapid thermal treatment on stacked titanium, aluminum, nickel, and gold.

Referring to FIG. 2B, a first insulating layer 203 is formed on an entire surface of the substrate 201. The first insulating layer 203 may include silicon nitride or silicon oxide. The first insulating layer 203 may be formed using a plasma enhanced chemical vapor deposition (PECVD) method or a sputtering method. The first insulating layer 203 may support a T-type gate electrode 213 in FIG. 2Q or 2R and may protect an active region of the substrate 201. The first insulating layer 203 may have a thickness within a range of about 1,500 Å to about 2,000 Å.

Referring to FIG. 2C, a first image reversal photoresist pattern 204 partially exposing the first insulating layer 203 is formed for formation of a field plate electrode 205 of FIG. 2E.

Forming the first image reversal photoresist pattern 204 may include: coating an image reversal photoresist layer on the first insulating layer 203; baking the coated image reversal photoresist layer; and performing an exposure process using a mask on the baked image reversal photoresist layer. A light source used in the exposure process may be an i-line ultraviolet (UV) ray having a wavelength of about 365 nm. After the exposure process is performed, an image reversal baking process, an entire surface exposure process, and a developing process may be performed to form the first image reversal photoresist pattern 204 partially exposing the first insulating layer 203. The image reversal baking process may be performed at a temperature of about 113 degrees Celsius for about 3 minutes.

The first image reversal photoresist pattern 204 may have a thickness within a range of about 1.1 μm to about 1.2 μm. The first image reversal photoresist pattern 204 may include an opening having a width of about 0.5 μm to about 1.5 μm. The opening of the first image reversal photoresist pattern 204 may partially expose the first insulating layer 203.

Referring to FIG. 2D, a conductive layer 205 for a field plate electrode may be formed an entire surface of the substrate 201. The conductive layer 205 for the field plate electrode may be deposited on the entire surface of the substrate 201 by an electron beam vacuum deposition method. The conductive layer 205 for the field plate electrode may include nickel/gold and may have a thickness within a range of about 3,000 Å to about 4,500 Å. At this time, the conductive layer 205 on the first insulating layer 203 in the opening corresponds to the field plate electrode 205. The field plate electrode 205 on the first insulating layer 203 in the opening may have a width within a range of about 0.5 μm to about 1.5 μm.

Referring to FIG. 2E, the conductive layer 205 on the first image reversal photoresist pattern 204 except the field plate electrode 205 on the first insulating layer 203 is removed simultaneously with the first image reversal photoresist pattern 204 by a lift-off process removing the first image reversal photoresist pattern 204.

Referring to FIG. 2F, a photoresist layer 206 is formed on the entire surface of the substrate 201 having the field plate electrode 205. The photoresist layer 206 may include polymethyl methacrylate (PMMA). The photoresist layer 206 may have a thickness within a range of about 2,500 Å to about 3,000 Å. A baking process may be performed on the photoresist layer 206. The baking process of the photoresist layer 206 may be performed at a temperature of about 190 degrees Celsius for 2 minutes.

Referring to FIG. 2G, a first opening 207 is formed to expose a portion of the first insulating layer 203 which is adjacent to the field plate electrode 205. An exposure process using a mask may be performed on the photoresist layer 206 and then a developing process may be performed to form the first opening 207. In an embodiment, a plasma ashing process may be performed in order that a residue of the photoresist layer 206 does not remain in the first opening 207. The first opening 207 may have a width within a range of about 0.5 μm to about 0.7 μm.

Referring to FIG. 2H, the first insulating layer 203 exposed by the first opening 207 is removed to expose the substrate 201. The exposed first insulating layer 203 may be removed using a reactive ion etching (RIE) method. This is because the RIE method is an anisotropic dry etching method. Thus, a width of the exposed substrate 201 may be within a range of about 0.5 μm to about 0.7 μm. At this time, an over-etching process may be performed in order that the first insulating layer 203 does not remain on the exposed substrate 201.

Referring to FIG. 2I, a second insulating layer 208 is formed on the entire surface of the substrate 201 having the first opening 207 exposing the substrate 201. The second insulating layer 208 may include silicon nitride or silicon oxide. The second insulating layer 208 may be formed using a PECVD method or a sputtering method. The second insulating layer 208 may support the T-type gate electrode 213 of FIG. 2Q or 2R and may protect the active region of the substrate 201. The second insulating layer 208 may be formed to have a thickness of about 1,000 Å.

A second opening 209 having a width of about 0.3 μm to about 0.5 μm may be defined by the formation of the second insulating layer 208.

Referring to FIG. 2J, the second insulating layer 208 under the second opening 209 is removed to expose the substrate 201 under the second opening 209. The second insulating layer 208 under the second opening 209 may be removed using a RIE method. Thus, a width of the exposed substrate 201 under the second opening 209 may be within a width of about 0.3 μm to about 0.5 μm. At this time, an over-etching process may be performed in order that a residual of the second insulating layer 208 does not remain on the exposed substrate 201 under the second opening 209.

Referring to FIG. 2K, the photoresist layer 206 is removed. The photoresist layer 206 may be removed by a lift-off process using acetone. At this time, the second insulating layer 206 disposed on the photoresist layer 206 may be removed simultaneously with the photoresist layer but the second insulating layer 206 defining the second opening 209 may remain.

Referring to FIG. 2L, a third insulating layer 210 may be formed on the entire surface of the substrate 201 having the second opening 209 which exposes the substrate 201 and is defined by the remaining second insulating layer 208. The third insulating layer 210 may include silicon nitride or silicon oxide. The third insulating layer 210 may be formed using a PECVD method or a sputtering method. The third insulating layer 210 may support the T-type gate electrode 213 of FIG. 2Q or 2R. The third insulating layer 210 may be formed to have a thickness of about 1,000 Å.

A third opening 211 having a width of about 0.1 μm to about 0.3 μm may be defined by the formation of the third insulating layer 210.

Referring to FIG. 2M, the third insulating layer 210 under the third opening 211 is removed to expose the substrate 201 disposed under the third opening 211. The third insulating layer 210 under the third opening 211 may be removed by a RIE method. Thus, a width of the exposed substrate 201 under the third opening 211 may be within a range of about 0.1 μm to about 0.3 µm. At this time, an over-etching process may be performed in order that a residual of the third insulating layer 210 does not remain on the exposed substrate 201 under the third opening 211.

Referring to FIG. 2N, portions of the first, second, and third insulating layers 203, 208, and 210 are removed to expose the source electrode 202s and the drain electrode 202d. The portions of the first, second, and third insulating layers 203, 208, and 210 may be removed using a RIE method. Thus, top surfaces of the remaining first, second, and third insulating layers 203, 208, and 210 may be disposed at a lower level than a top surface of the field plate electrode 205.

Referring to FIG. 2O, a second image reversal photoresist pattern 212 having a fourth opening may be formed on the substrate 201 having the exposed source and drain electrodes 202s and 202d. The fourth opening has a width greater than the width of the first opening 207 in FIG. 2H.

Forming the second image reversal photoresist pattern 212 may include: coating an image reversal photoresist layer on the entire surface of the substrate 201; baking the coated image reversal photoresist layer; and performing an exposure process using a mask on the baked image reversal photoresist layer. A light source used in the exposure process for the second image reversal photoresist pattern 212 may be an i-line ultraviolet (UV) ray having a wavelength of about 365 nm. After the exposure process is performed, an image reversal baking process, an entire surface exposure process, and a developing process may be performed to form the second image reversal photoresist pattern 212 having the fourth opening. The fourth opening exposes the third opening 211 and portions of the first, second, and third insulating layers 203, 208, and 210 adjacent to the third opening 211. The image reversal baking process of the second image reversal photoresist pattern 212 may be performed at a temperature of about 113 degrees Celsius for about 3 minutes.

The second image reversal photoresist pattern 212 may have a thickness within a range of about 1.1 µm to about 1.2 µm. The fourth opening of the second image reversal photoresist pattern 212 may have a width of about 1.0 µm to about 1.2 µm. As described above, the fourth opening of the second image reversal photoresist pattern 212 may expose the third opening 211 and portions of a plurality of the insulating layers 203, 208, and 210 adjacent to the third opening 211.

The substrate 201 exposed by the third opening 211 may be recessed by a dry etching method using an inductively coupled plasma (ICP). The dry etching method may use boron trichloride (BCl$_3$)/chlorine (Cl$_2$) gases, so that the substrate 201 may be selectively etched. The substrate 201 may be selectively recessed so that a desired current may flow between the source electrode 202s and the drain electrode 202d. Thus, the high electron mobility transistor capable of controlling the current may be realized.

Referring to FIG. 2P, a conductive layer 213 for a gate electrode may be formed on the entire surface of the substrate 201. The conductive layer 213 for the gate electrode may be deposited on the entire surface of the substrate 201 by an electron beam vacuum deposition method. The conductive layer 213 for the gate electrode may include nickel/gold and may have a thickness of about 3,000 Å to about 4,500 Å. At this time, the conductive layer 213 in the fourth opening corresponds to a T-type gate electrode 213. The T-type gate electrode 213 fills the third opening 211 of FIG. 2O. A foot portion of the T-type gate electrode 213, which fills the third opening 211, may have a width within a range of about 0.1 µm to about 0.3 µm. A head portion of the T-type gate electrode 213 in the fourth opening of the second image reversal photoresist pattern 212 may have a width within a range of about 1.0 µm to about 1.2 µm. As described above, the fourth opening has a width greater than the width of the first opening 207 in FIG. 2H. Thus, the head portion of the T-type gate electrode 213 has a width greater than the width of the first opening 207 in FIG. 2H.

Referring to FIG. 2Q, the conductive layer 213 disposed on the second image reversal photoresist pattern 212 is removed simultaneously with the second image reversal photoresist pattern 212 by a lift-off process removing the second image reversal photoresist pattern 212. At this time, the T-type gate electrode 213 remains on the substrate 201.

Referring to FIG. 2R, portions of the first and third insulating layers 203 and 210 disposed around the T-type gate electrode 213 and the field plate electrode 205 are removed except portions of the first and third insulating layers 203 and 210 which are disposed under the T-type gate electrode 213 and the field plate electrode 205. The portions of the first and third insulating layers 203 and 210 disposed around the T-type gate electrode 213 and the field plate electrode 205 may be removed by a RIE method. Thus, high electron mobility transistor including the field plate electrode 205 and the T-type gate electrode 213 may be realized.

The high electron mobility transistor formed by the fabricating method according to the inventive concept uses the insulating layers 203, 208, and 210 for supporting the T-type gate electrode 213. Thus, stability of the T-type gate electrode 213 may be improved and a fine width of the foot portion of the T-type gate electrode 213 may be maintained. Additionally, the high electron mobility transistor has the insulating layers 203, 208, and 210 confined between the head portion of the T-type gate electrode 213 and the substrate 201. Thus, a drain output characteristic of the high electron mobility transistor may be improved and it is possible to reduce parasitic capacitances between the T-type gate electrode 213 and the source electrode 202s and between the T-type gate electrode 213 and the drain electrode 202d. Moreover, since the high electron mobility transistor has the T-type gate electrode 213 of which a length is reduced, a cutoff frequency and a high frequency characteristic of the high electron mobility transistor may be improved. Furthermore, since a double-layered or triple-layered electron beam photoresist layer is not used for fabrication of the high electron mobility transistor, a fabricating time and fabricating costs of the high electron mobility transistor may be reduced. As a result, it is possible to realize the high electron mobility transistor of the low fabrication costs, the improved stability, the reduced parasitic capacitance, and the improved high frequency characteristic.

Additionally, the high electron mobility transistor formed by the fabricating method according to embodiments further includes the field plate electrode 205 contacting a sidewall portion or a bottom portion of the head portion of the T-type gate electrode 213. Thus, an electric field concentrated at a lower corner of the head portion of the T-type gate electrode 213 may be effectively relieved. As a result, a breakdown voltage of the high electron mobility transistor may increase, so that a high voltage characteristic of the high electron mobility transistor may also be improved.

According to the aforementioned embodiments of the inventive concept, the high electron mobility transistor uses the insulating layers for supporting the T-type gate electrode, such that the stability of the T-type gate electrode may be improved and the fine width of the foot portion of the T-type gate electrode may be maintained. Additionally, the insulating layers may be confined between the head portion of the T-type gate electrode and the substrate, such that the drain output characteristic may be improved and the parasitic capacitances may be reduced. Moreover, since the high electron mobility transistor has the T-type gate electrode of which the length is reduced, the cutoff frequency and the high frequency characteristic may be improved. Furthermore, since the double-layered or triple-layered electron beam photoresist layer is not used for fabrication of the high electron mobility transistor, the fabricating time and fabricating costs of the high electron mobility transistor may be reduced. As a result, it is possible to realize the high electron mobility transistor of the low fabrication costs, the improved stability, the reduced parasitic capacitance, and the improved high frequency characteristic.

Additionally, the field plate electrode is in contact with the sidewall portion or the bottom portion of the head portion of the T-type gate electrode. Thus, the electric field may be effectively relieved at the lower corner of the head portion of the T-type gate electrode. As a result, to breakdown voltage of the high electron mobility transistor may increase to the high voltage characteristic of the high electron mobility transistor.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A high electron mobility transistor comprising:
   a source electrode and a drain electrode spaced apart from each other on a substrate;
   a T-type gate electrode disposed on the substrate between the source electrode and the drain electrode; and
   a plurality of insulating layers disposed between the substrate and the T-type gate electrode,
   wherein the plurality of insulating layers includes a first insulating layer, a second insulating layer, and a third insulating layer;
   wherein the third insulating layer is disposed between the substrate and a head portion of the T-type gate electrode such that a first portion of the third insulating layer is in contact with a foot portion of the T-type gate electrode;
   wherein the second insulating layer is disposed between the substrate and the head portion of the T-type gate electrode such that the second insulating layer is in contact with the third insulating layer; and
   wherein the first insulating layer and a second portion of the third insulating layer are sequentially stacked between the substrate and the head portion of the T-type gate electrode so as to be in contact with the second insulating layer.

2. The high electron mobility transistor of claim 1, wherein the substrate is an insulating substrate.

3. The high electron mobility transistor of claim 2, wherein the insulating substrate includes silicon, silicon carbide, or sapphire.

4. The high electron mobility transistor of claim 1, wherein the foot portion of the T-type gate electrode has a width within a range of about 0.1 μm to about 0.3 μm.

5. The high electron mobility transistor of claim 1, wherein the plurality of insulating layers includes silicon nitride or silicon oxide.

6. The high electron mobility transistor of claim 1, further comprising:
   a field plate electrode disposed between the T-type gate electrode and the source electrode or between the T-type gate electrode and the drain electrode.

7. The high electron mobility transistor of claim 6, wherein the field plate electrode is in contact with a sidewall portion or a bottom portion of the head portion of the T-type gate electrode.

8. The high electron mobility transistor of claim 6, wherein the first insulating layer is also disposed between the substrate and an entire bottom surface of the field plate electrode.

9. The high electron mobility transistor of claim 6, wherein a top surface of the field plate electrode is disposed at a lower level than a top surface of the head portion of the T-type gate electrode.

10. A method of fabricating a high electron mobility transistor, the method comprising:
    forming a source electrode and a drain electrode spaced apart from each other on a substrate;
    forming a first insulating layer on an entire surface of the substrate;
    forming a photoresist layer having a first opening exposing a portion of the first insulating layer between the source electrode and the drain electrode;
    removing the portion of the first insulating layer under the first opening to expose the substrate under the first opening;
    forming a second insulating layer on the entire surface of the substrate, wherein a portion of the second insulating layer in the first opening defines a second opening having a narrower width than the first opening;
    removing the second insulating layer under the second opening to expose the substrate under the second opening;
    removing the photoresist layer and the rest portion of the second insulating layer except the portion of the second insulating layer defining the second opening;
    forming a third insulating layer on the entire surface of the surface to define a third opening in the second opening, the third opening having a narrower width than the second opening;
    removing the third insulating layer under the third opening to expose the substrate under the third opening;
    removing portions of the first, second, and third insulating layers to expose the source electrode and the drain electrode; and
    forming a T-type gate electrode contacting the substrate through the third opening,
    wherein a head portion of the T-type gate electrode has a width greater than the width of the first opening.

11. The method of claim 10, wherein the substrate is an insulating substrate.

12. The method of claim 11, wherein the insulating substrate includes silicon, silicon carbide, or sapphire.

13. The method of claim 10, wherein the third opening has a width within a range of about 0.1 μm to about 0.3 μm.

14. The method of claim 10, wherein the first, second, and third insulating layers include silicon nitride or silicon oxide.

15. The method of claim 10, further comprising:
    forming a field plate electrode between the T-type gate electrode and the source electrode or between the T-type gate electrode and the drain electrode.

16. The method of claim 15, wherein forming the field plate electrode comprises:
    forming a first image reversal photoresist pattern on the first insulating layer, the first image reversal photoresist pattern having a fourth opening exposing a portion of the first insulating layer;
    forming a conductive layer on the exposed portion of first insulating layer and on the first image reversal photoresist pattern; and removing the first image reversal photoresist pattern and the conductive layer disposed on the first image reversal photoresist pattern to leave the conductive layer disposed on the exposed portion of the first insulating layer,
wherein the fourth opening is formed to be adjacent to the field plate electrode.

17. The method of claim 15, wherein the field plate electrode is in contact with a sidewall portion or a bottom portion of the head portion of the T-type gate electrode.

18. The method of claim 10, wherein each of the first, second, and third insulating layers under the first, second, and third openings is removed using a reactive ion etching method.

19. The method of claim 10, wherein forming the T-type gate electrode comprises:
   forming a second image reversal photoresist pattern having a fifth opening on the substrate having the exposed source and drain electrodes, the fifth opening having a width greater than the width of the first opening;
   forming a conductive layer in the third and fifth openings and on the second image reversal photoresist pattern; and
   removing the second image reversal photoresist pattern and the conductive layer on the second image reversal photoresist pattern to leave the conductive layer disposed in the third and fifth openings.

20. The method of claim 19, further comprising:
removing the first and third insulating layers around the T-type gate electrode.

* * * * *